(12) United States Patent
Gruen et al.

(10) Patent No.: US 6,793,849 B1
(45) Date of Patent: Sep. 21, 2004

(54) N-TYPE DROPING OF NANOCRYSTALLINE DIAMOND FILMS WITH NITROGEN AND ELECTRODES MADE THEREFROM

(75) Inventors: Dieter M. Gruen, Downers Grove, IL (US); Alan R. Krauss, deceased, late of Naperville, IL (US), Julie R. Krauss, Executor; Orlando H. Auciello, Bolingbrook, IL (US); John A. Carlisle, Plainfield, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 10/398,427
(22) PCT Filed: Oct. 9, 2001
(86) PCT No.: PCT/US01/31528
§ 371 (c)(1),
(2), (4) Date: Dec. 12, 2003
(87) PCT Pub. No.: WO02/31839
PCT Pub. Date: Apr. 18, 2002

Related U.S. Application Data

(60) Provisional application No. 60/314,142, filed on Aug. 22, 2001, and provisional application No. 60/239,173, filed on Oct. 9, 2000.

(51) Int. Cl.[7] .............................. H01B 1/04; B01J 3/06; C01B 31/06; C23C 16/27; C30B 29/04

(52) U.S. Cl. .......................... 252/502; 117/88; 117/929; 423/446; 427/577; 427/585; 427/249; 427/249.7; 427/249.8

(58) Field of Search ..................... 252/502; 204/192.15; 117/79, 88, 929; 423/446; 427/577, 585, 249, 249.7, 249.8, 902

(56) References Cited

U.S. PATENT DOCUMENTS

| | | | | |
|---|---|---|---|---|
| 4,277,293 | A | * 7/1981 | Nelson et al. | 423/446 |
| 5,462,776 | A | * 10/1995 | Gruen | 427/577 |
| 5,990,604 | A | * 11/1999 | Geis et al. | 313/309 |
| 6,110,276 | A | * 8/2000 | Yu et al. | 117/94 |
| 6,303,225 | B1 | * 10/2001 | Veerasamy | 428/408 |

OTHER PUBLICATIONS

Zhou et al "Synthesis and electron filed emission of nanocrystalline diamond films . . . ", Journal of Applied Physics, 82(9), pp 4546–50. See Abstract.*

* cited by examiner

Primary Examiner—Mark Kopec
(74) Attorney, Agent, or Firm—Emrich & Dithmar, LLC.

(57) ABSTRACT

An electrically conducting n-type ultrananocrystalline diamond (UNCD) having no less than $10^{19}$ atoms/cm$^3$ of nitrogen is disclosed. A method of making the n-doped UNCD. A method for predictably controlling the conductivity is also disclosed.

28 Claims, 6 Drawing Sheets

US 6,793,849 B1

N-TYPE DROPING OF NANOCRYSTALLINE DIAMOND FILMS WITH NITROGEN AND ELECTRODES MADE THEREFROM

RELATED APPLICATIONS

This application, pursuant to 37 C.F.R. 1.78(c), claims priority based on provisional application serial No. 60/239,173 filed on Oct. 9, 2000 and provisional application serial No. 60/314,142 filed on Aug. 22, 2001.

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

BACKGROUND OF THE INVENTION

The use of diamond as an electronic material has remained elusive for many years. The problem lies in the difficulty of finding a way to dope diamond so that it's ambient temperature conductivity and carrier mobility are sufficiently high to make diamond-based devices work at room or ambient temperature. Traditional doping with nitrogen does not work, since nitrogen forms a deep donor level 1.7 eV below the conduction band, and thus is not thermally activated at room temperature. This is due to the fact that nitrogen is very reluctant to insert into the diamond lattice, and all efforts to dope microcrystalline diamond with electrically active nitrogen have to date met with very limited success.

The inventors and others at Argonne National Laboratory have worked for several years developing the use of microwave plasma enhanced chemical vapor deposition (MPCVD) to produce ultrananocrystalline diamond (UNCD) thin films. These films are grown using argon-rich plasmas rather than the traditional hydrogen-rich plasmas, which are routinely used to grow microcrystalline diamond films, as disclosed in U.S. Pat. No. 5,462,776, the disclosure of which is incorporated by reference.

The UNCD films have grain boundaries are almost atomically abrupt (~0.5 nm) and have been measured on the average of 0.3 to 0.4 nm. These UNCD films exhibit exceptional mechanical and tribological properties, the latter particularly applicable to the development of a new microelectromechanical system (MEMS) technology based on UNCD. For purposes of this application, UNCD shall be defined as films grown from $C_2$ dimers, as set forth in the '776 patent.

SUMMARY OF THE INVENTION

This invention relates to n-type doping of UNCD films, that is films with average grain size of less than about 15 nm, as opposed to films with larger grain sizes, such as microcrystalline or nanocrystalline diamond. When nitrogen gas was added to gas mixtures used to grow UNCD, the conductivity of the films unexpectedly increased by more than five orders of magnitude, while the grain boundaries and the grain size become larger.

Accordingly, it is an object of the present invention to provide an electrically conducting ultrananocrystalline diamond having about $10^{19}$ atoms/cm$^3$ nitrogen with an electrical conductivity of not less than about 0.1 $\Omega^{-1}$cm$^{-1}$.

Another object of the present invention is to provide an electrically conducting ultrananocrystalline diamond having an average grain size of about 15 nm or less and nitrogen present in an amount of not less than about $10^{19}$ atoms/cm$^3$ made by the process of providing a source of carbon and a source of nitrogen and subjecting the sources of carbon and nitrogen in vapor form to an energy source in an noble-gas atmosphere to create a plasma to form an ultrananocrystalline material, wherein carbon is present in an amount less than about 2% by volume of the source gas.

Yet another object of the present invention is to provide a process for producing electrically conducting ultrananocrystalline diamond films, comprising subjecting a mixture of nitrogen and carbon containing gas and noble gas to an energy source to deposit nitrogen-incorporated ultrananocrystalline diamond films, wherein the atomic percent of carbon in the source gas is less that about 2%, and the nitrogen is present in the range of from about 2% to about 50% by volume to produce an ultrananocrystalline material with nitrogen present in an amount not less than about $10^{19}$ atoms/cm$^3$.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1A:
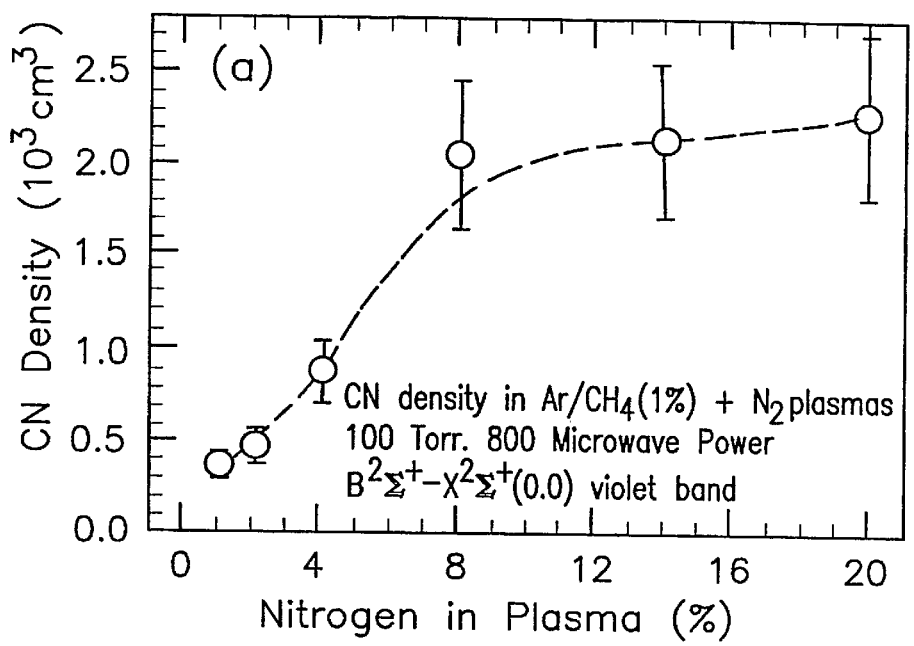
FIG. 1(a) is a graphical representation of the relationship of the concentration of CN radicals as a function of nitrogen in the plasma.
Figure 1B:
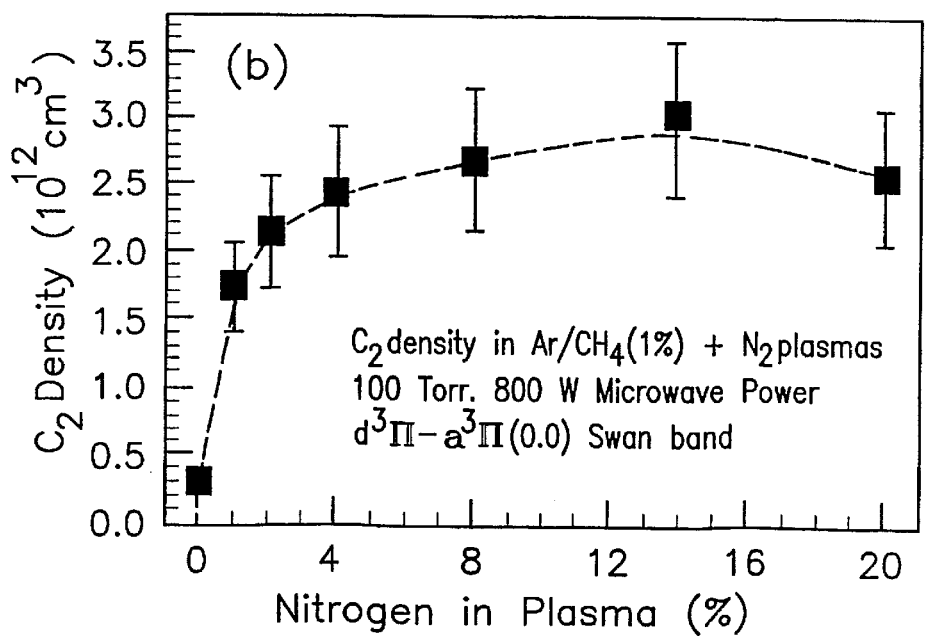
FIG. 1(b) is a graphical representation of the relationship of the concentration of $C_2$ radicals as a function of nitrogen in the plasma.

This invention relates to the incorporation of dopants into UNCD thin films, in particular, the incorporation of nitrogen via the addition of $N_2$ gas to the carbon containing noble gas plasma. When we use $CH_4$ it is a short hand for the sources of carbon set forth below, and when we use argon it is a short hand for any noble gas.

The inventive films were grown on a variety of metals and non-metals using microwave plasma chemical vapor deposition with gas mixtures of $Ar/CH_4(1\%-2\%)/N_2(1-20\%)$ at total pressures of 100 Torr and 800 W of microwave power, while the substrates were maintained at temperatures from about 350° C. to about 800° C.

Essentially all the grains of UNCD films have the stated grain sizes, and by essentially all we mean greater than about 90% and preferably greater than about 95%. Moreover, UNCD films may be produced using up to about 2% by volume of $CH_4$ or a precursor thereof or $C_2H_2$ or a precursor thereof or a $C_{60}$ compound.

The number densities of the $C_2$ and CN radicals formed in the plasma increase proportionally with nitrogen content in the plasma up to 5%, as measured by absorption spectroscopy. Secondary ion mass spectroscopy (SIMS) data show that the content of nitrogen in the film saturates at about $1 \times 10^{19}$ atoms/cm$^3$ (~0.2% total nitrogen content in the film) when the nitrogen concentration in the plasma is 5%. The conductivity at room temperature increases dramatically with nitrogen concentration, from 0.016 (1% $N_2$) to 143 $\Omega^{-1}$cm$^{-1}$ (20% $N_2$). This is to be compared with the best values reported previously: $10^{-6}$ $\Omega^{-1}$cm$^{-1}$ for nitrogen-doped microcrystalline diamond and 0.33 $\Omega^{-1}$cm$^{-1}$ for phosphorous-doped microcrystalline diamond films.

Grain boundaries (GBs) in UNCD are believed to be high-energy, high-angle GBs. Molecular dynamics simulations of diamond (100) twist GBs have revealed that they have a large fraction os sp$^2$-bonded atoms. Tight-binding calculations for $\Sigma$13 and $\Sigma$29 GBs revealed that electronic states are introduced into the band gap of the UNCD films, due to dangling bonds and $\pi$-bonded carbon atoms in the GBs.

Temperature dependent conductivity and Hall measurements are both indicative of multiple, thermally activated conduction mechanisms with effective activation energies of <0.1 eV. This behavior is very similar to highly-boron-doped microcrystalline diamond. However, the inventors do not believe that nitrogen is acting in the manner boron does. It is believed that conduction occurs via the grain boundaries and not the grains. Tight-binding molecular dynamic simulations have shown that nitrogen incorporation into the high-angle grain boundaries is favored by 3–5 eV over substitution into the bulk. Nitrogen increases the amount of three-fold coordinated carbon atoms in the grain boundaries (GB) and leads to additional electronic states near the Fermi level. The inventors believe that GB conduction involving carbon $\pi$-states in the GB is responsible for the high conductivities. It has been shown that many of these states near the Fermi-level are delocalized over several carbon nearest neighbors.

Some of the inventive films were grown either on Si(100) or insulating silica ($SiO_2$) substrates (for transport measurements) at 800° C., using a $CH_4(1\%)/Ar/N_2$ gas mixture at a total gas pressure of 100 Torr and 800 W microwave power. However, other substrates, such as various metals and non-metals may also be used. The average $C_2$ and CN radical densities in the plasma were determined in situ using absorption spectroscopy. These results are shown in FIGS. 1(a) and (b). Equivalent widths of rotational lines within the d$^3\Pi$-a$^3\Pi$(0,0) Swan band of $C_2$ and the B$^2\Sigma^+$-X$^2\Sigma^+$(0,0) violet band of CN were integrated and converted into column densities using published values of he band oscillator strengths weighted by the appropriate H önl-London and Boltzmann factors using a gas temperature of 1600 K, which had been determined previously by rotational analysis.

As shown in FIGS. 1(a) and (b) the densities of both the $C_2$ and CN radicals increase substantially as $N_2$ gas is added to the plasma, while their ratio changes as well. For small additions of $N_2$ (1%–5%), the effect is to increase the density of $C_2$ dimers by one order of magnitude. As the $N_2$ content approaches 8%, the relative density of $C_2$ to CN decreases by a factor of 5. This trend in the data is also reflected by accompanying changes in film morphology, total nitrogen content, and conductivity, as discussed below.

High-resolution transmission electron micrographs (HRTEM) from UNCD films synthesized using either 1% or 20% $N_2$ in the plasma show substantial microstructural changes, as shown in FIG. 6(a)–6(d). For low-nitrogen partial pressures (<5%) the morphology of the films remains largely unchanged, with the average grain size and average GB widths increasing only slightly. However, in films made using 10% or more $N_2$, both the average grain size and average GB widths increase significantly, to 12 and 1.5 nm, respectively. Films made using 20% $N_2$ have average grain sizes about 15 nm and average GB width of 2 nm. The contrast in the HRTEM images between the GBs and the diamond grains suggests that the GBs are less dense than the grains. We believe this is evidence of an increase in sp$^2$ bonding in these regions of the films.

The inventive films have a substantially different microstructure than prior art films. For instance, Zhou et al. in J. Appl. Phys. 82(9), 1 Nov. 1997 report a nanocrystalline thin film grown from $N_2/CH_4$ microwave plasma. The Zhou et al. films were grown in an entirely different plasma than the inventive materials described herein. The Zhou et al. plasma contained no nobel gas, whereas the predominant portion of the plasma used to grow the inventive material is a nobel gas. With $N_2$ present in the 20–25 volume percent range and carbon present in the 2 atom percent range, the nobel gas would be present in an amount of at least 73 volume percent for the inventive process and materials produced thereby.

Figure 3:
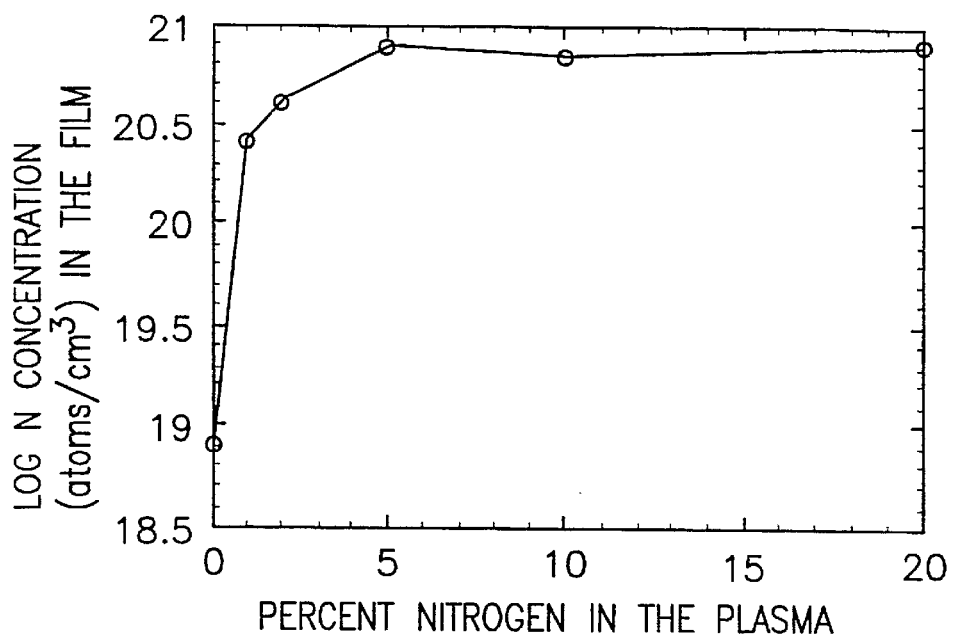
FIG. 3 is a graphical representation of the relationship of the concentration of nitrogen incorporated in the UNCD films versus the percent nitrogen in the feed gas of the plasma.
Figure 4:
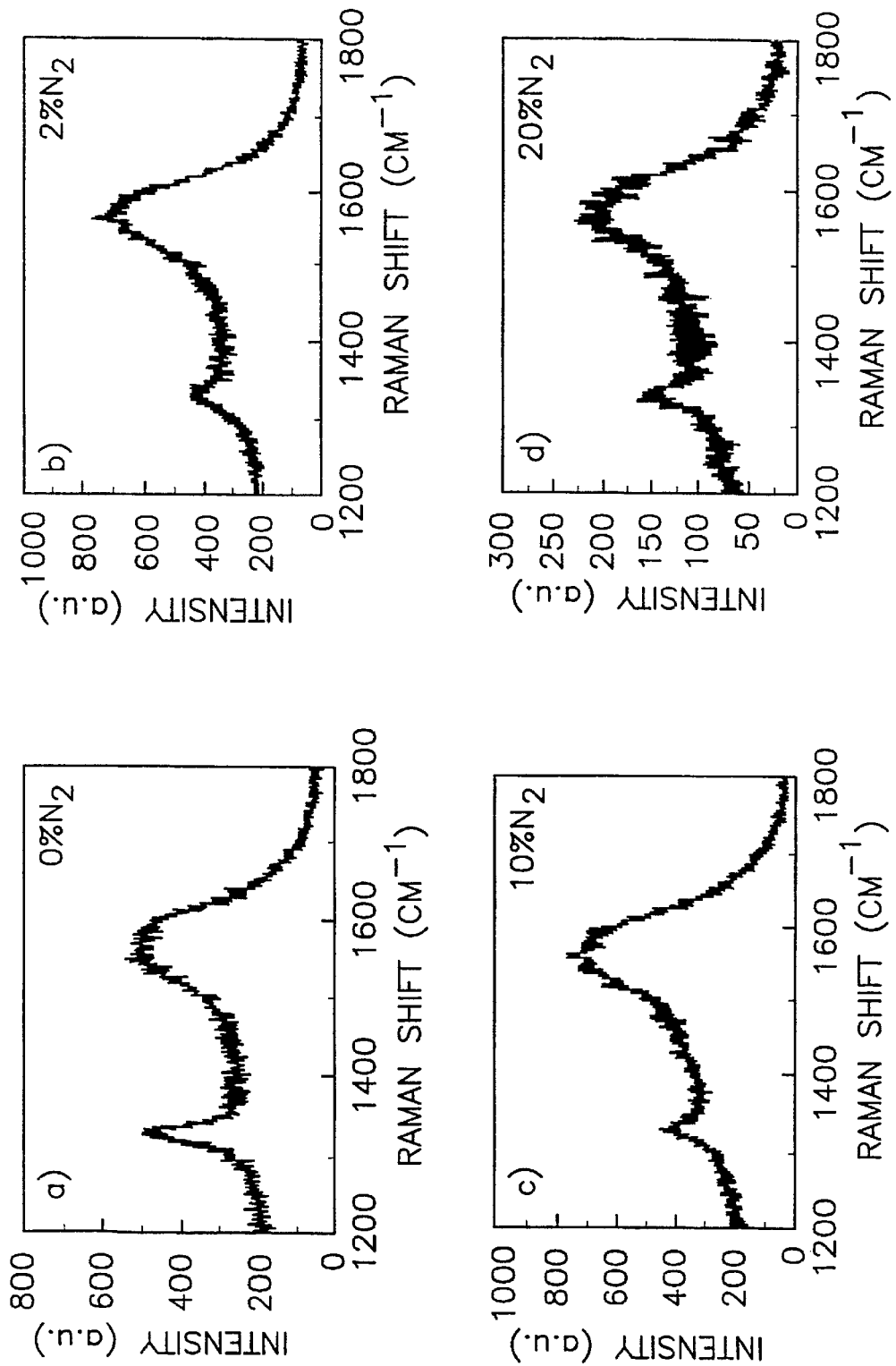
FIGS. 4(a)–(d) are UV Raman spectra of UNCD films: a) without nitrogen in the gas chemistry, and with b) 2%, c) 10% and d)20% nitrogen, showing that all the nitrogen-added films have approximately the same sp$^2$sp$^3$ ratio, which is increased 25–30% over the non-nitrogen film.

As stated, the Zhou et al. material does not have the same microstructure as the inventive films. The inventive materials have a clear grain+GB morphology, whereas the films studies by Zhou et al. do not, as shown in FIG. 3 of that paper. Furthermore, the average grain size of the Zhou et al. material is believed to be substantially larger (about 30–50 nm, based again on FIG. 3 on their paper) than the average grain size of the inventive material, which is between about 2 nm or less to about 15 nm.

Figure 2:
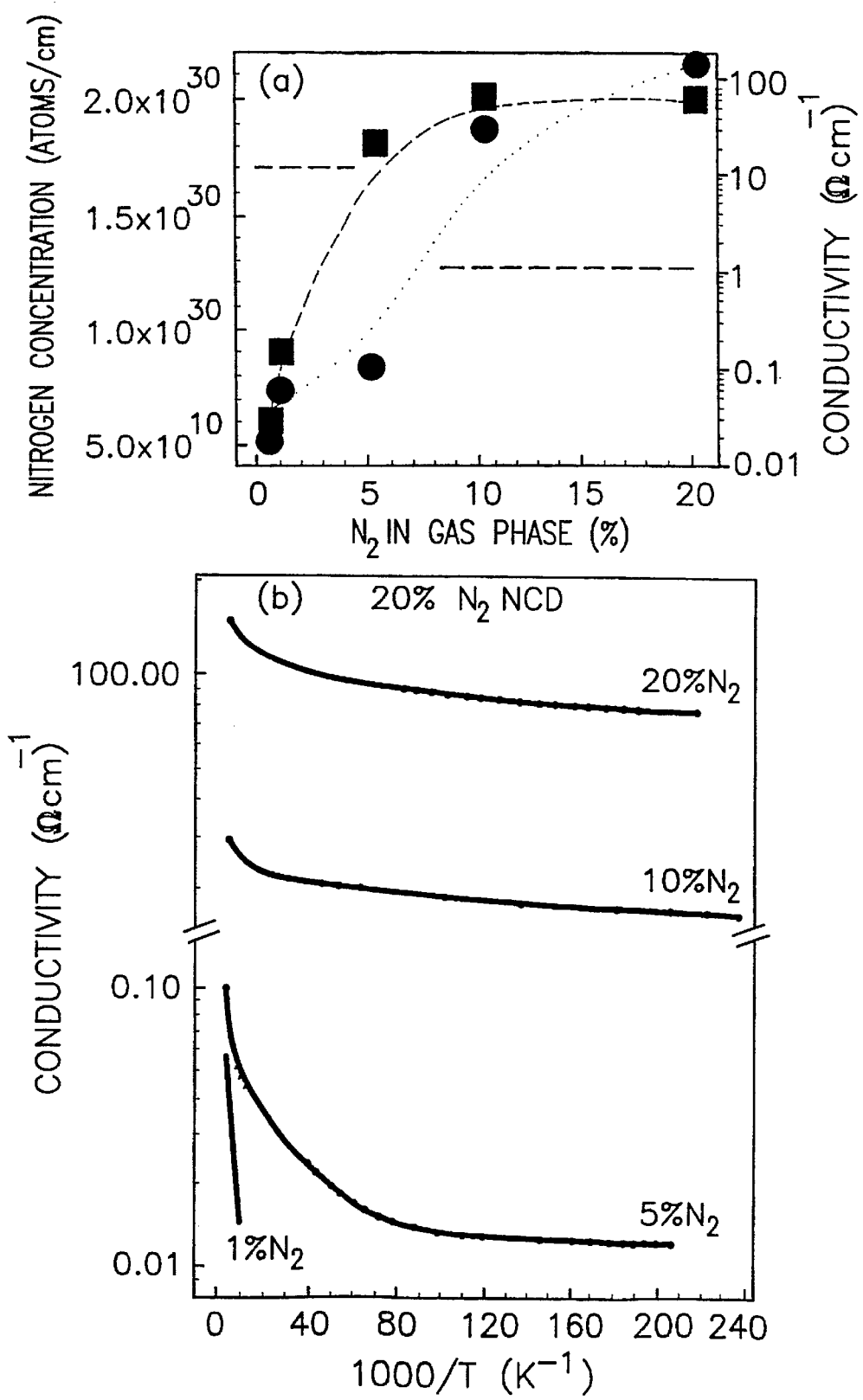
FIG. 2(a) is a graphical representation of the relationship of total nitrogen content (left axis) and room-temperature conductivity (right axis) in a UNCD film as a function of nitrogen in the plasma.
FIG. 2(b) is an Arrhenius plot of conductivity data obtained in the temperature range 300–4.2 K for a series of UNCD films synthesized using different nitrogen concentrations in the plasma as shown.

Four-point-probe conductivity measurements in the temperature range 300–4.2K were performed using both linear and van der Pauws geometries. These results are shown in FIGS. 2(a) and (b). In additional, FIG. 2(a) shows secondary ion mass spectroscopy (SIMS) data for the total nitrogen content in the films as a function of the percentage of $N_2$ gas added to the plasma. Along with these data is a plot of the room-temperature conductivities for the same films. The SIMS data indicate that the nitrogen content in the films initially increases but then saturates at ~$2\times10^{20}$ atoms/cm$^{-3}$ for 5%N$_2$ in the plasma, which corresponds to about 0.2% total nitrogen content in the film. The increase in room-temperature conductivity is both dramatic and unexpected, increasing from 0.016 $\Omega^{-1}$cm$^{-1}$ (for 1% N$_2$) to 143 $\Omega^{-1}$cm$^{-1}$ (for 20%N$_2$), which represents an increase by roughly five orders of magnitude over undoped UNCD films. The latter value is much higher than any other previously reported for n-type diamond and is comparable to heavily boron-doped p-type diamond. Materials made with source gases having up to about 23–25% N$_2$ show substantially conductivity, but at 25% N$_2$ it is believed the conductivity begins to decrease.

Temperature-dependent conductivity data in the range of 300–4.2 K are shown in the Arrhenius plot in FIG. 2(b). These data are remarkable for several reasons. First, it is clear that these films exhibit finite conduction for temperatures even as low as 4.2 K. This behavior is also seen in heavily boron-doped diamond thin films. Also, these curves are clearly not simple straight lines in the Arrhenius plot, which is indicative of multiple, thermally activated conduction mechanism with different activation energies. These curves can be modeled by a summation of exponential functions as has been done in other studies where impurity conduction due to boron doping is dominant over the normal band conduction in doped single-crystal and polycrystalline diamond. We do not, however, expect that the present case is an example of degenerate doping of UNCD with nitrogen.

Hall measurements (mobility, carrier concentration, Hall coefficient) have been made on two of the UNCD films grown with 10% and 20% nitrogen in the plasma. The carrier concentrations for the 10% and 20% N$_2$ samples, were found to be $2.0\times10^{19}$ and $1.5\times10^{20}$ cm$^{-3}$, respectively. The latter concentration is two orders of magnitude larger than any previous result for n-type diamond, and comparable to the carrier density in heavily boron-doped diamond. We also find reasonable high room-temperature carrier mobilities of 5 and 10 cm$^2$/Vs for the 10% and 20% films, respectively. The negative value of the Hall coefficients indicates that electrons are the majority carriers in each of these films.

It is seen therefore that the electrical conductivity of a nitrogen doped UNCD material can be systematically and reproducibly adjusted, permitting a material or film to be made with a predetermined electrical conductivity. For instance, adding 5% nitrogen results in a material having a conductivity of about 0.1 ($\Omega$cm)$^{-1}$ while adding 10% nitrogen results in a material having a conductivity of about 30 ($\Omega$cm)$^{-1}$, see FIGS. 2(a)(b). The ability to predetermine and vary the conductivity of UNCD materials is entirely new and unexpected. Previously materials were made and then their conductivities were measured, but there was no method of making materials having a specifically desired conductivity, until this invention.

We believe that conduction occurs via the grain boundaries based on the above data and the following considerations. Nitrogen in microcrystalline diamond thin films usually forms a deep donor level with an activation energy of 1.7 eV. Therefore, it is unlikely that the enhanced conductivity in UNCD is due to nitrogen doping of the grains as previously believed, but rather at the grain boundaries. With the theoretical calculations indicating that nitrogen is favored by 3–5 eV for GB doping, we believe that the nitrogen in these films is present predominantly in the GBs and not within the grains. Using ultrananocrystalline diamond rather than microcrystalline or even nanocrystalline diamond because the smaller the grains, the larger number of grain boundaries and it is at the grain boundaries that the effective nitrogen doping occurs.

Our tight-binding calculations assuming nitrogen substitution in the GBs shows that new electronic states associated with carbon $\pi$ bonds and dangling bonds are introduced into the fundamental gap, and that there are unoccupied states available near the Fermi level. When nitrogen is introduced into the GBs, the associated carbon dangling-bond state is above the Fermi level and donates electron-to-carbon defect states near the Fermi level, causing it to shift upward (i.e., toward the conduction band). Thus, it is not unreasonable to believe that nearest-neighbor hopping or other thermally activated conduction mechanisms could occur in the GBs and result in greatly enhanced electron transport. The conduction may occur via the new carbon states in the band gap.

Other films produced according to this invention were prepared by mechanically polishing n-type silicon wafers (resistivity 0.001–1.0 $\Omega$-cm) with 0.1 micron diamond powder for approximately 10 minutes. The Si substrates were then placed in the PECVD chamber. The films were grown at 800° C., 100 Torr total pressure, 100 sccm total gas flow rate, and 800 W microwave power. These conditions are by way of example only and are not meant to limit the invention. It is now within the skill of the art to produce ultrananocrystalline diamond using a variety of conditions and techniques. The content of the source gas mixture was changed by successively adding N$_2$ to replace argon in 1% CH$_4$/99% Ar plasmas. Films with 1% CH$_4$ and 0% N$_2$/99% Ar to 20% N$_2$/79% Ar were grown and were approximately one micron in thickness. The films were then characterized using secondary ion mass spectrometry (SIMS), transmission electron microscopy (TEM), UV Raman spectroscopy, and scanning electron microscopy (SEM).

SIMS analysis was performed using a high-mass resolution SIMS. It is necessary to examine the CN ion because the hydrocarbon masses interfere with the positive nitrogen secondary ions, and there are no stable nitrogen negative secondary ions. High mass resolution is required to analyze CN (26.003 amu) to distinguish it from C$_2$H$_2$ (26.015 amu). FIG. 3 displays the secondary ion mass spectroscopy results as nitrogen concentration in the film versus the percent nitrogen in the plasma during film growth. Since the base pressure of the PECVD system is approximately 1 mTorr, about $8\times10^{18}$ atoms/cm$^3$ of nitrogen, slightly less than 0.01 atomic percent, is present in the UNCD film due to atmospheric nitrogen contamination. With the addition of 1% N$_2$ to the plasma, the concentration of nitrogen in the film increases an order of magnitude to $2.5\times10^{20}$ atoms/cm$^3$, and continues to rise until about 5% nitrogen is added the plasma. No further increase in nitrogen in the film is observed even when 20% N$_2$ is added to the plasma. The concentration of nitrogen incorporated in the film therefore saturates at about $8\times10^{20}$ atoms/cm$^3$.

TEM electron diffraction patterns for a film without added nitrogen and one with 2% nitrogen can be completely indexed on the diamond lattice, no other crystalline phase was found. The grain size distribution of such films is on the order of 3–15 nm.

FIGS. 4(a)–(d) show the UV Raman spectra of UNCD films with varying degrees of nitrogen content. The introduction of nitrogen results in an increase in the peak at 1580 cm$^{-1}$ relative to the peak at 1332 cm$^{-1}$, which is the phonon peak for diamond. The relative ratio of sp$^2$ to sp$^3$, however, remains roughly independent of the nitrogen concentration. By integrating the areas under the Raman curves in FIGS. 4(a)–(b), the present increase in the sp$^2$:sp$^3$ ratio for the nitrogen films is calculated as 25–30%.

Figure 5:
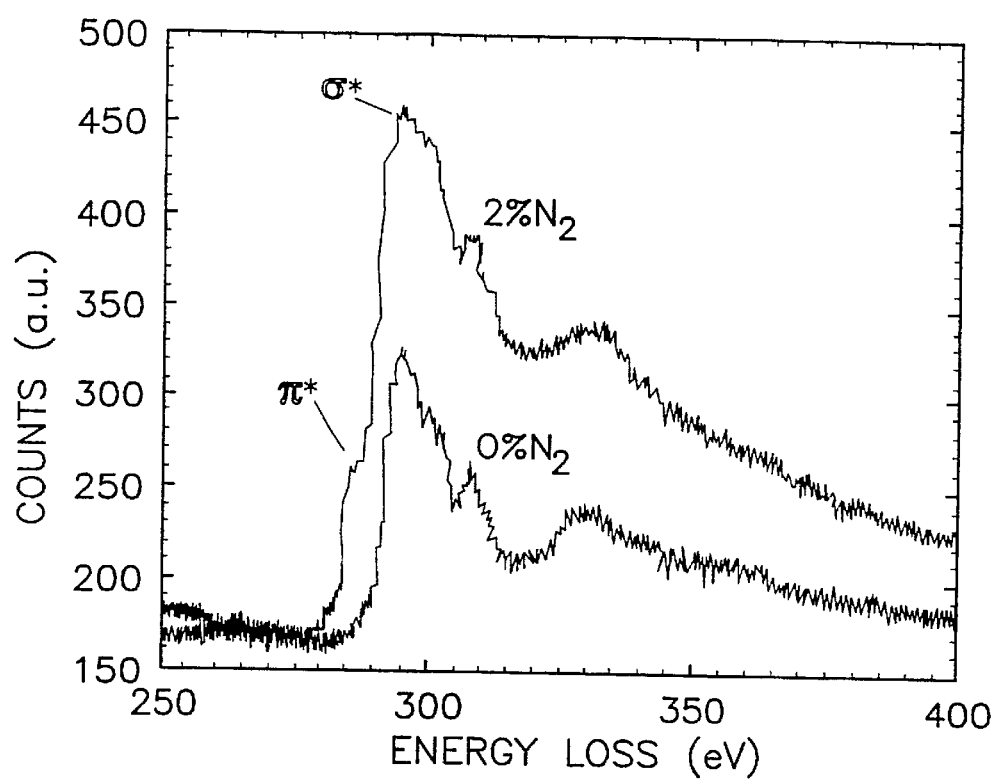
FIG. 5 is EELS spectra of a UNCD film with 2% nitrogen and without nitrogen in the plasma, showing a distinct shoulder in the nitrogen film indicating sp$^2$ bonded carbon.
Figure 6:
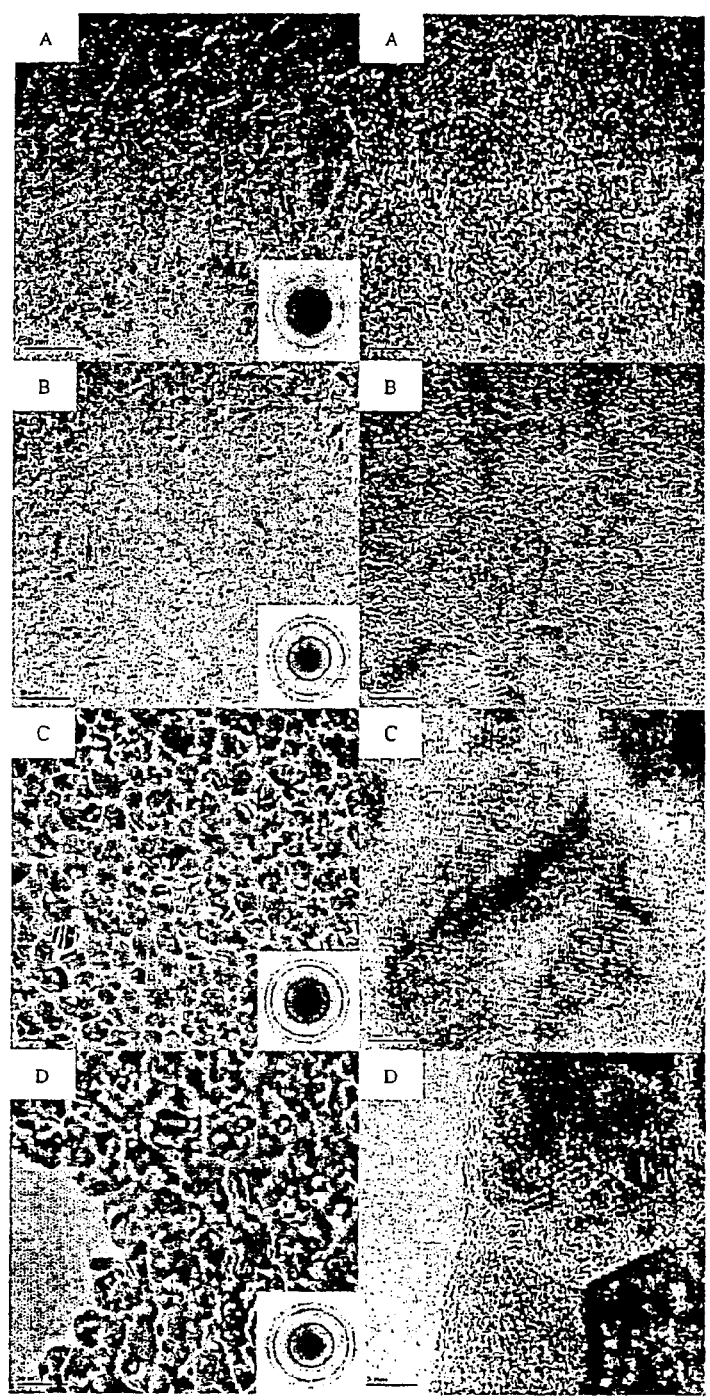
FIGS. 6(a)–6(d) are low and high resolution TEM micrographs of a.) 0% $N_2$ b.) 5% $N_2$ UNCD, c.) 10% $N_2$ UNCD, and d.) 20% $N_2$ UNCD films. Low resolution micrographs are on the left, high resolution on the right. The figures are scaled so that the low resolution micrographs are 350 nm by 350 nm and the high resolution ones are 35 nm by 35 nm.

FIG. 5 shows the electron energy loss spectra (EELS) for UNCD films without nitrogen and with 2% nitrogen to the plasma, respectively. The EELS of the nitrogen-grown diamond film reveals the K-edge δ* peak at 291 and a distinct π* peak originating form the $sp^2$ carbon K edge at 286 eV. The film grown without nitrogen shows only the δ* peak by EELS measurements.

Recent density-functional based tight-binding (DFTB) calculations have been performed, which may explain the increase in the $sp^2$:$sp^3$ in the films with nitrogen and show that nitrogen substitution into the grain boundaries rather than into the diamond lattice, is energetically favorable by 2.6 to 5.6 eV, depending on the specific grain boundary site. The calculations suggest that three-fold coordinated sites are the lowest energy sites for nitrogen and that these promote $sp^2$ bonding in the neighboring carbon. The theoretical calculations are thus in agreement with the experimental results, which show a 25–30% relative increase in $sp^2$ bonding.

In summary, nitrogen-doped UNCD thin films have been synthesized using a microwave plasma CVD technique with a $CH_4$/Ar/$N_2$ gas mixture. Other carbon containing gases also are applicable, as well as other deposition methods and other noble gases, as previously stated. The morphology and transport properties of the films are both greatly affected by the presence and amount of CN in the plasma, which varies as $N_2$ gas is added. The HRTEM data indicated that the grain size and GB width of the UNCD films increase with the addition of $N_2$ in the plasma. Our transport measurements indicate that these films have the highest n-type electrical conductivity reported thus far in phase-pure diamond thin films.

While particular embodiments of the present invention have been shown and described, it will be appreciated by those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. An electrically conducting ultrananocrystalline diamond having not less than $10^{19}$ atoms/$cm^3$ nitrogen with an electrical conductivity at ambient temperature of not less than about 0.1 $(\Omega.cm)^{-1}$.

2. The electrically conducting ultrananocrystalline diamond of claim 1, wherein the ultrananocrystalline diamond is a film.

3. The electrically conducting ultrananocrystalline diamond of claim 1, wherein the ultrananocrystalline diamond has grain boundaries that are about 0.2 to about 2.0 nm wide.

4. The ultrananocrystalline diamond of claim 1, wherein the average grain size is between about 3 and 15 nm.

5. The electrically conducting-ultrananocrystalline diamond of claim 1, wherein the conductivity at ambient temperature is not less than about 1 $(\Omega cm)^{-1}$.

6. The electrically conducting ultrananocrystalline diamond of claim 1, wherein the conductivity at ambient temperature is not less than about 10 $(\Omega cm)^{-1}$.

7. The electrically conducting ultrananocrystalline diamond of claim 1, wherein the conductivity at ambient temperature is not less than about 100 $(\Omega cm)^{-1}$.

8. An electrically conducting ultrananocrystalline diamond having an average grain size of about 15 nm or less and nitrogen present in an amount of not less than about $10^{19}$ atoms/$cm^3$ made by the process of providing a source of carbon and a source of nitrogen and subjecting the sources of carbon and nitrogen in vapor form to an energy source in an noble-gas atmosphere to create a plasma to form an ultrananocrystalline material, wherein carbon is present in an amount less than about 2 atom percent of the source gas.

9. The electrically conducting ultrananocrystalline diamond of claim 8, wherein the diamond is a film grown on a substrate maintained at a temperature not less than about 350° C. during the deposition process.

10. The electrically conducting ultrananocrystalline diamond of claim 8, wherein the source of carbon is one or more of $CH_4$ or a precursor thereof and $C_2H_2$ or a precursor thereof and a $C_{60}$ compound.

11. The electrically conducting ultrananocrystalline diamond of claim 10, wherein the nitrogen is present in the source gas in an amount of less than about 20% by volume.

12. The electrically conducting ultrananocrystalline diamond of claim 11, wherein the atomic percent of carbon in the source gas is about 1% and the nitrogen is present in an amount less than about 20% by volume, the balance being a noble gas.

13. The electrically conducting ultrananocrystalline diamond of claim 11, wherein the ultrananocrystalline diamond is a film grown on a substrate maintained at about 350–800° C. at total pressures of not less than about 100 Torr.

14. The electrically conducting ultrananocrystalline diamond of claim 13, wherein the substrate is a metal or a non-metal.

15. The electrically conducting ultrananocrystalline diamond of claim 13, wherein the substrate is silicon or silicon dioxide.

16. The electrically conductive ultrananocrystalline diamond of claim 8, wherein the conductivity at ambient temperature is not less than about 0.1 $(\Omega cm)^{-1}$.

17. The electrically conductive ultrananocrystalline diamond of claim 8, wherein the conductivity at ambient temperature is not less than about 1 $(\Omega cm)^{-1}$.

18. The electrically conductive ultrananocrystalline diamond of claim 8, wherein the conductivity at ambient temperature is not less than about 10 $(\Omega cm)^{-1}$.

19. The electrically conducting ultrananocrystalline diamond of claim 8, wherein the conductivity at ambient temperature is not less than about 100 $(\Omega cm)^{-1}$.

20. A process for producing electrically conducting ultrananocrystalline diamond films, comprising subjecting a mixture of nitrogen and carbon containing gas and noble gas to an energy source to deposit nitrogen-incorporated ultrananocrystalline diamond films, wherein the atomic percent of carbon in the source gas is less than about 2%, and the nitrogen is present in the range of from about 2% to about 25% by volume to produce an ultrananocrystalline material with nitrogen present in an amount not less than about $10^{19}$ atoms/$cm^3$.

21. The process claim 20, wherein the source of carbon is one or more of $CH_4$ or a precursor thereof and $C_2H_2$ or a precursor thereof and a $C_{60}$ compound.

22. The process of claim 21, wherein the atomic percent of carbon in the source gas is about 1% and the nitrogen is present in an amount not greater than about 20% by volume, the balance being argon.

23. The process of claim 22, wherein the electrically conducting ultrananocrystalline diamond is a film grown on a Si or $SiO_2$ substrate maintained at about 800° C. at total pressures of about 100 Torr and about 800 watts of microwave power.

24. The process of claim 20, wherein the electrically conducting ultrananocrystalline diamond has a conductivity at ambient temperature of not less than about 0.1 $(\Omega cm)^{-1}$.

25. The process of claim 20, wherein the electrically conducting ultrananocrystalline diamond has a conductivity at ambient temperature of not less than about 1 $(\Omega cm)^{-1}$.

26. The process of claim 20, wherein the electrically conducting ultrananocrystalline diamond has a conductivity at ambient temperature of not less than about 10 $(\Omega cm)^{-1}$.

27. The process of claim 20, wherein the electrically conducting ultrananocrystalline diamond has a conductivity at ambient temperature of not less than about 100 $(\Omega cm)^{-1}$.

28. A process for producing electrically conducting ultrananocrystalline diamond material having a predetermined conductivity, comprising subjecting a mixture of nitrogen and carbon containing gas and noble gas to an energy source to deposit nitrogen-incorporated ultrananocrystalline diamond films, wherein the atomic percent of carbon in the source gas is less than about 2%, and the nitrogen at a preselected concentration in the range of from about 2% to about 25% by volume to produce an ultrananocrystalline material with nitrogen present in an amount not less than about $10^{19}$ atoms/cm$^3$ having a predetermined conductivity of not less than about 0.01 $(\Omega cm)^{-1}$.

\* \* \* \* \*

UNITED STATES PATENT AND TRADEMARK OFFICE
CERTIFICATE OF CORRECTION

PATENT NO. : 6,793,849 B1
DATED : September 21, 2004
INVENTOR(S) : Dieter M. Gruen et al.

It is certified that error appears in the above-identified patent and that said Letters Patent is hereby corrected as shown below:

Title page,
Item [54], Title, should read as:
-- N-TYPE DOPING OF NANOCRYSTALLINE DIAMOND FILMS WITH NITROGEN AND ELECTRODES MADE THEREFROM --.

Signed and Sealed this

Thirty-first Day of January, 2006

JON W. DUDAS
*Director of the United States Patent and Trademark Office*